(12) United States Patent
Wang et al.

(10) Patent No.: US 10,044,356 B2
(45) Date of Patent: Aug. 7, 2018

(54) BAND SELECTED CLOCK DATA RECOVERY CIRCUIT AND ASSOCIATED METHOD

(71) Applicant: HIMAX TECHNOLOGIES LIMITED, Tainan (TW)

(72) Inventors: Jing-Yuan Wang, Tainan (TW); Chuan-Chien Hsu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/397,743

(22) Filed: Jan. 4, 2017

(65) Prior Publication Data
US 2018/0191358 A1 Jul. 5, 2018

(51) Int. Cl.
| H03L 7/08 | (2006.01) |
| H04L 7/00 | (2006.01) |
| H04L 7/02 | (2006.01) |
| H03L 7/087 | (2006.01) |
| H03L 7/099 | (2006.01) |

(52) U.S. Cl.
CPC ............ *H03L 7/0807* (2013.01); *H03L 7/087* (2013.01); *H03L 7/099* (2013.01); *H04L 7/0008* (2013.01); *H04L 7/02* (2013.01)

(58) Field of Classification Search
CPC ....... H03L 7/0807; H03L 7/087; H03L 7/099; H04L 7/0008; H04L 7/02
See application file for complete search history.

(56) References Cited

U.S. PATENT DOCUMENTS

| 5,909,150 A * | 6/1999 | Kostelnik | G11B 20/1403 327/156 |
| 5,959,502 A * | 9/1999 | Ovens | H03K 3/0231 331/17 |
| 7,492,195 B1 * | 2/2009 | Patil | H03L 7/1976 327/147 |
| 7,602,260 B1 * | 10/2009 | Atesoglu | H03B 27/00 331/186 |
| 7,696,831 B2 * | 4/2010 | Song | H03L 7/0893 327/156 |
| 8,159,275 B2 * | 4/2012 | Kim | H03L 7/08 327/147 |
| 8,860,482 B1 * | 10/2014 | Liu | H03L 7/099 327/148 |
| 2010/0090723 A1 * | 4/2010 | Nedovic | H03D 13/008 327/3 |

(Continued)

*Primary Examiner* — Sophia Vlahos
(74) *Attorney, Agent, or Firm* — Winston Hsu

(57) ABSTRACT

A clock data recovery (CDR) circuit includes: a band select circuit, a low dropout regulator (LDO), a charge pump and a voltage-controlled oscillator (VCO), wherein the band select circuit is arranged to generate a digital signal according to at least a reference voltage; the LDO is arranged to regulate a ground voltage, wherein the LDO adjusts an operating band of the LDO by receiving at least a part of the digital signal to adjust a bias current of an amplifier of the LDO; the charge pump is arranged to generate a control voltage according to at least a part of the digital signal; and the VCO is arranged to generate a clock signal according to the control voltage, wherein the VCO adjusts an operating band of the CDR circuit by receiving at least a part of the digital signal to adjust a bias current of the VCO.

13 Claims, 4 Drawing Sheets

(56) References Cited

U.S. PATENT DOCUMENTS

| | | | | |
|---|---|---|---|---|
| 2010/0264964 A1* | 10/2010 | Furuta | ............... | H03L 7/0893 |
| | | | | 327/157 |
| 2011/0080199 A1* | 4/2011 | Yen | ............... | H03L 7/093 |
| | | | | 327/157 |
| 2011/0260760 A1* | 10/2011 | Wu | ............... | H03L 7/0898 |
| | | | | 327/148 |
| 2016/0315627 A1* | 10/2016 | Kawamoto | ............... | H03B 5/1228 |

\* cited by examiner

BAND SELECTED CLOCK DATA RECOVERY CIRCUIT AND ASSOCIATED METHOD

BACKGROUND OF THE INVENTION

1. Field of the Invention

The present invention relates to a clock data recovery (CDR) circuit, and more particularly, to a band selected CDR circuit and an associated method.

2. Description of the Prior Art

In a conventional thin film transistor (TFT) liquid crystal display (LCD) system, the ground noise from high voltage (e.g. 12 Volts) will induce jitter in a CDR circuit which causes poor performance. Furthermore, for a wide band application (160 MHz-1.8 GHz), components installed in the CDR circuit such as a voltage-controlled oscillator (VCO) are required to respond to different frequency bands in order to obtain a better performance. Otherwise, the clock signal generated by the VCO might introduce more jitter.

SUMMARY OF THE INVENTION

One of the objectives of the present invention is therefore to provide a band selected CDR circuit to solve the problems of the related art.

According to an embodiment of the present invention, a clock data recovery (CDR) circuit is disclosed, the CDR circuit comprising: a band select circuit, a low dropout regulator (LDO), a charge pump and a voltage-controlled oscillator (VCO), wherein the band select circuit is arranged to generate a digital signal according to at least a reference voltage; the LDO is arranged to regulate a ground voltage, wherein the LDO adjusts an operating band of the LDO by receiving at least a part of the digital signal to adjust a bias current of an amplifier of the LDO; the charge pump is arranged to generate a control voltage according to at least a part of the digital signal; and the VCO is arranged to generate a clock signal according to the control voltage, wherein the VCO adjusts an operating band of the CDR circuit by receiving at least a part of the digital signal to adjust a bias current of the VCO.

According to an embodiment of the present invention, a clock data recovery (CDR) method for a CDR circuit is disclosed, the method comprising: generating a digital signal according to a reference voltage and a control voltage; utilizing a low dropout regulator (LDO) to regulate a ground voltage, wherein the LDO adjusts an operating band of the LDO by receiving at least a part of the digital signal to adjust a bias current of an amplifier of the LDO; generating a control voltage according to at least a part of the digital signal; and
utilizing a voltage-controlled oscillator (VCO) to generate a clock signal according to the control voltage, wherein the VCO adjusts an operating band of the CDR circuit by receiving at least a part of the digital signal to adjust a bias current of the VCO.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
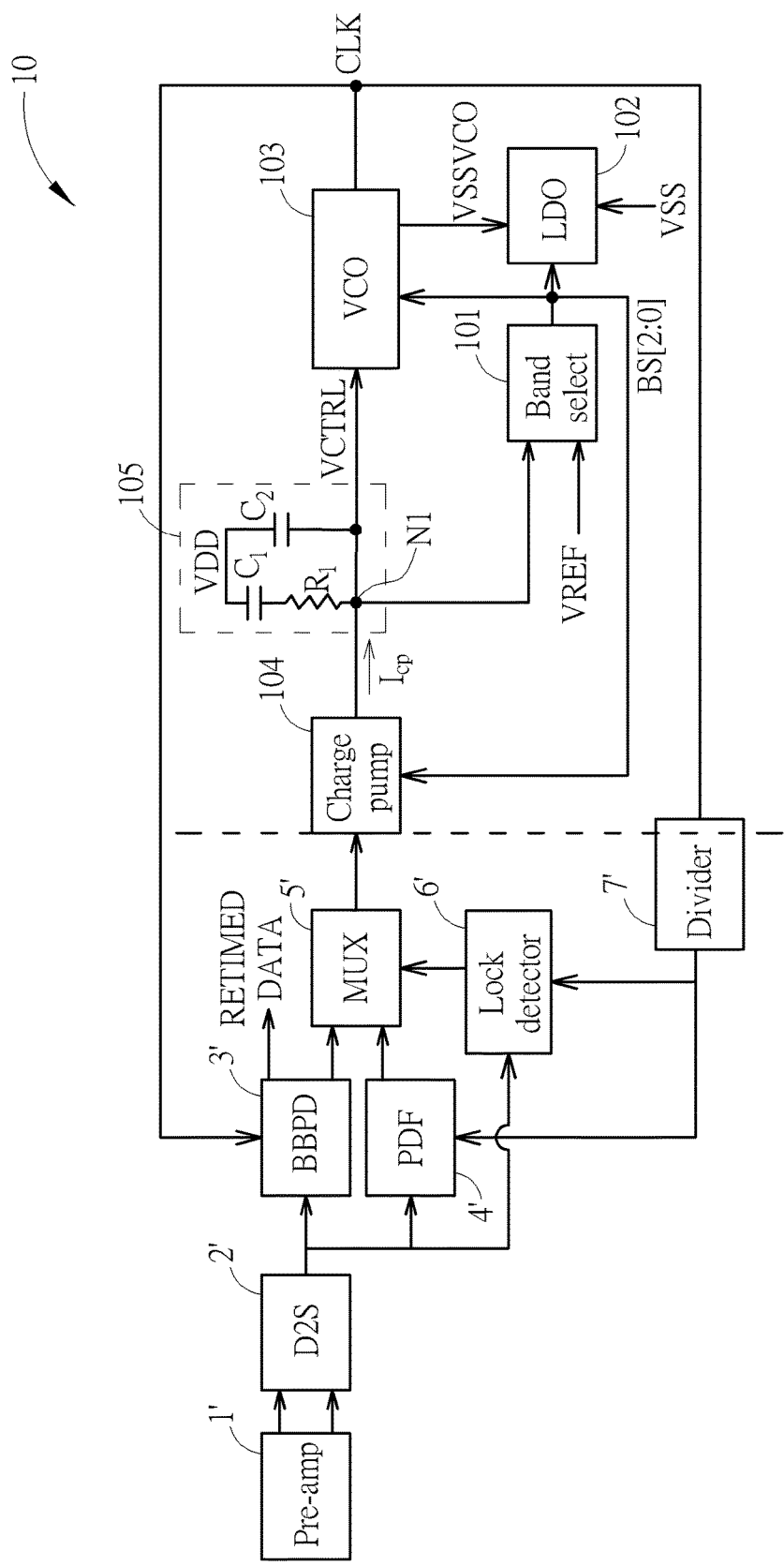
FIG. 1 is a diagram illustrating a clock data recovery circuit according to an embodiment of the present invention.

FIG. 1 is a diagram illustrating a clock data recovery (CDR) circuit 10 according to an embodiment of the present invention. As shown in FIG. 1, the CDR circuit 10 comprises typical components including a pre-amplifier 1', a differential-to-single (D2S) circuit 2', a bang bang phase detector (BBPD) 3', a phase frequency detector (PFD) 4', a multiplexer (MUX) 5', a lock detector 6', and a frequency divider 7', and further comprises a band select circuit 101, a low dropout regulator (LDO) 102, a voltage-controlled oscillator (VCO) 103, a charge pump 104, and a low pass filter 105. The present invention applies a band select technique on the LDO 102, the VCO 103 and the charge pump 104 (those components to the right of the dotted line). A detailed description of the above-mentioned typical components (those components to the left of the dotted line) is omitted here for brevity. The band select circuit 101 is arranged to generate a band select digital signal BS by comparing a control voltage VCTRL and a reference voltage VREF. Please note that, in this embodiment, the band select digital signal BS comprises three digital bits; in other words, the band select digital signal BS can be written as BS[2:0]. This is only for illustrative purposes and not a limitation of the present invention. In other embodiments, the band select digital signal BS can comprise more or less than three bits based on a designer's consideration.

The LDO 102 is arranged to regulate a ground voltage VSS by using a regulating ground voltage VSSVCO generated by the VCO 103 in order to prevent a ground noise from a high voltage influencing other circuits of the integrated circuit (IC) where the CDR circuit 10 is installed. The LDO circuit 102 is further arranged to receive at least a part of the band select digital signal BS, e.g. two bits of the band select digital signal BS (i.e. BS [2:1]), to thereby adjust the operating band of the LDO 102 by changing the bias current therein.

The VCO 103 is arranged to generate a clock signal CLK according to the control voltage VCTRL, wherein after the ground voltage being regulated by the LDO, the jitter which usually accompanies the clock signal CLK generated by the VCO 103 can be reduced. The VCO 103 is further arranged to receive the band select digital signal BS to adjust the operating band of the LDO 102 by changing the bias current. The architecture of the LDO 102 and the VCO 103 will be discussed in the following paragraphs.

The charge pump 104 is arranged to generate the control voltage VCTRL by transmitting a current $I_{cp}$ to the LPF 105, wherein the current $I_{cp}$ is adjusted by at least a part of the band select digital signal BS, e.g. two bits of the band select digital signal BS (i.e. BS [2:1]). Table 1 shows the current $I_{cp}$ corresponding to the two bits of the band select digital signal BS. It should be noted that the variation of the current $I_{cp}$ corresponding to the band select digital signal BS is only for illustrative purposes, and not a limitation of the present invention.

TABLE 1

| BS2 | BS1 | $I_{cp}$ |
|---|---|---|
| 0 | 0 | 1X |
| 0 | 1 | 2X |
| 1 | 0 | 3X |
| 1 | 1 | 4X |

As shown in FIG. 1, the LPF 105 comprises a resistor R1, and capacitors C1 and C2, wherein a terminal of the resistor R1 is coupled to a node N1, the other terminal of the resistor R1 is coupled to a terminal of the capacitor C1, the other terminal of the capacitor C1 is coupled to a supply voltage VDD, a terminal of the capacitor C2 is also coupled to the node N1, and the other terminal of the capacitor C2 is coupled to the supply voltage VDD. It should be noted that the architecture of the LPF 105 in this embodiment is only for illustrative purposes, and not a limitation of the present invention. Those skilled in the art should readily understand other implementations of the LPF 105.

Considering a clock signal generated by a conventional CDR circuit (without the band select circuit 101), assume that the conventional CDR circuit is operating in a high operating band. When the frequency of the clock signal is low, the strong (due to the high operating band) current $I_{cp}$ generated by the charge pump 104 causes a huge variation in the control voltage VCTRL which results in a huge variation in the frequency of the clock signal. Assuming that the conventional CDR circuit is operating in a low operating band, when the frequency of the clock signal is high, the weak (due to the low operating band) current $I_{cp}$ generated by the charge pump 104 means the control voltage VCTRL can only vary within a small range which results in poor spreading spectrum ability. With the band select circuit 101 proposed by the present invention which dynamically adjusts the current $I_{cp}$, the bias current of the VCO 103, and the bias current of the LDO 102 in response to the different frequency bands, the abovementioned problem can be effectively solved. More specifically, the LDO 102 and the VCO 103 can operate in a low operating band by reducing the bias current in response to a low frequency band, and operate in a high operating band by increasing the bias current in response to a high frequency band. The detailed operation will be described in the following paragraphs.

It should be noted that the architecture of the band select circuit 101 is not a limitation of the present invention. As long as the band select circuit 101 can generate the band select digital signal BS to adjust the operating band of the LDO 102 and the VCO 103 in response to the frequency of the control voltage VCTRL, all architectures fall within the scope of the present invention. For example, the band select circuit 101 can be implemented by comparators and logic gates.

Figure 2:
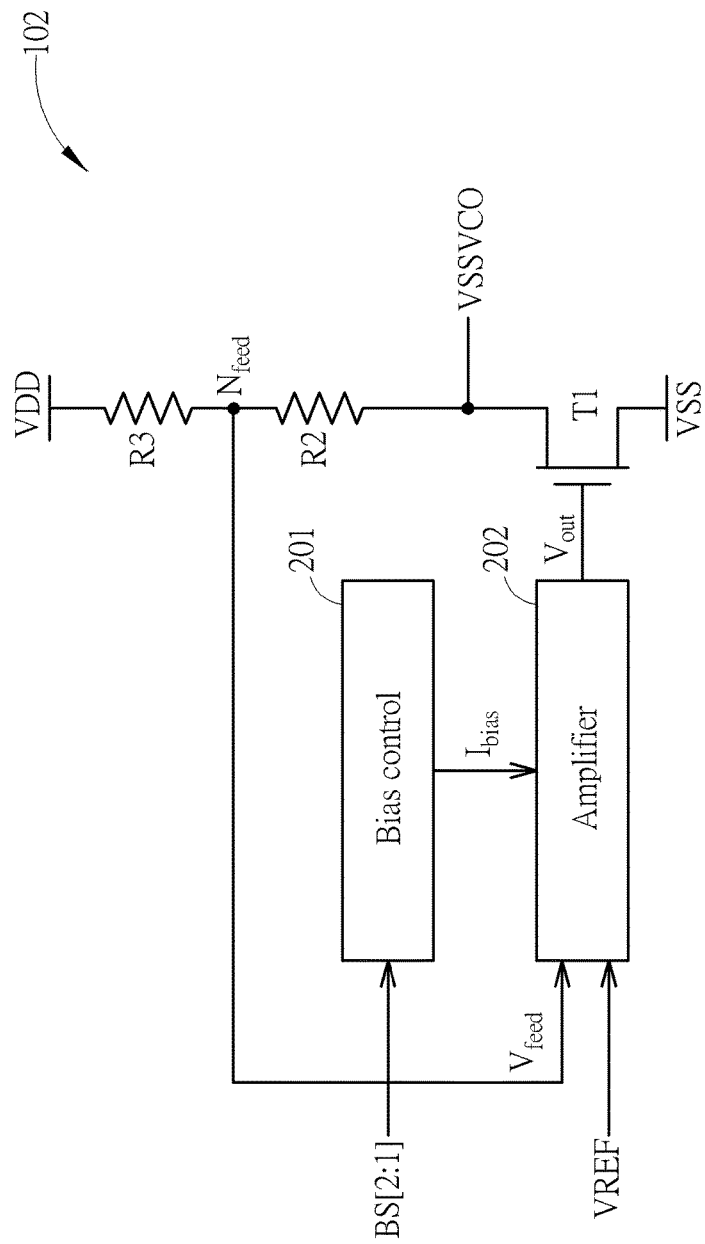
FIG. 2 is a diagram illustrating a low dropout regulator of the CDR circuit according to an embodiment of the present invention.

FIG. 2 is a diagram illustrating the LDO 102 of the CDR circuit 10 according to an embodiment of the present invention. The LDO 102 comprises a bias control circuit 201, an amplifier 202, a transistor T1, resistors R2 and R3, wherein the bias control circuit 201 is arranged to receive at least a part of the band select digital signal BS, e.g. two bits of the band select digital signal BS (i.e. BS[2:1]), to control a bias current $I_{bias}$ passing through the amplifier 202. Please note that, in this embodiment, the transistor T1 is implemented by an N-type Metal-Oxide-Semiconductor Field-Effect Transistor (NMOS); however, this is only for illustrative purposes, and not a limitation of the present invention. Table 2 shows the bias current $I_{bias}$ corresponding to the two bits of the band select digital signal BS (i.e. BS[2:1]).

TABLE 2

| BS2 | BS1 | $I_{bias}$ |
|---|---|---|
| 0 | 0 | 1X |
| 0 | 1 | 2X |
| 1 | 0 | 3X |
| 1 | 1 | 4X |

The amplifier 202 is arranged to generate an output voltage $V_{out}$ to a gate terminal of the transistor T1 according to a feedback voltage $V_{feed}$ and the reference voltage VREF. As shown in FIG. 2, a source terminal of the transistor T1 is coupled to the ground voltage VSS while the regulating ground voltage VSSVCO is received at a drain terminal of the transistor T1, and a terminal of the resistor R2 is coupled to the drain terminal of the transistor T1, the other terminal of the resistor R2 connected to a terminal of the resistor R3 is connected to a node $N_{feed}$, and the other terminal of the resistor R3 is coupled to the supply voltage VDD. The feedback voltage $V_{feed}$ received by the amplifier 202 is generated at the node $N_{feed}$. By adjusting the bias current $I_{bias}$ with the band select digital signal BS, the operating band of the LDO 102 can be adjusted to respond to different frequency bands of the CDR circuit 100.

Figure 3:
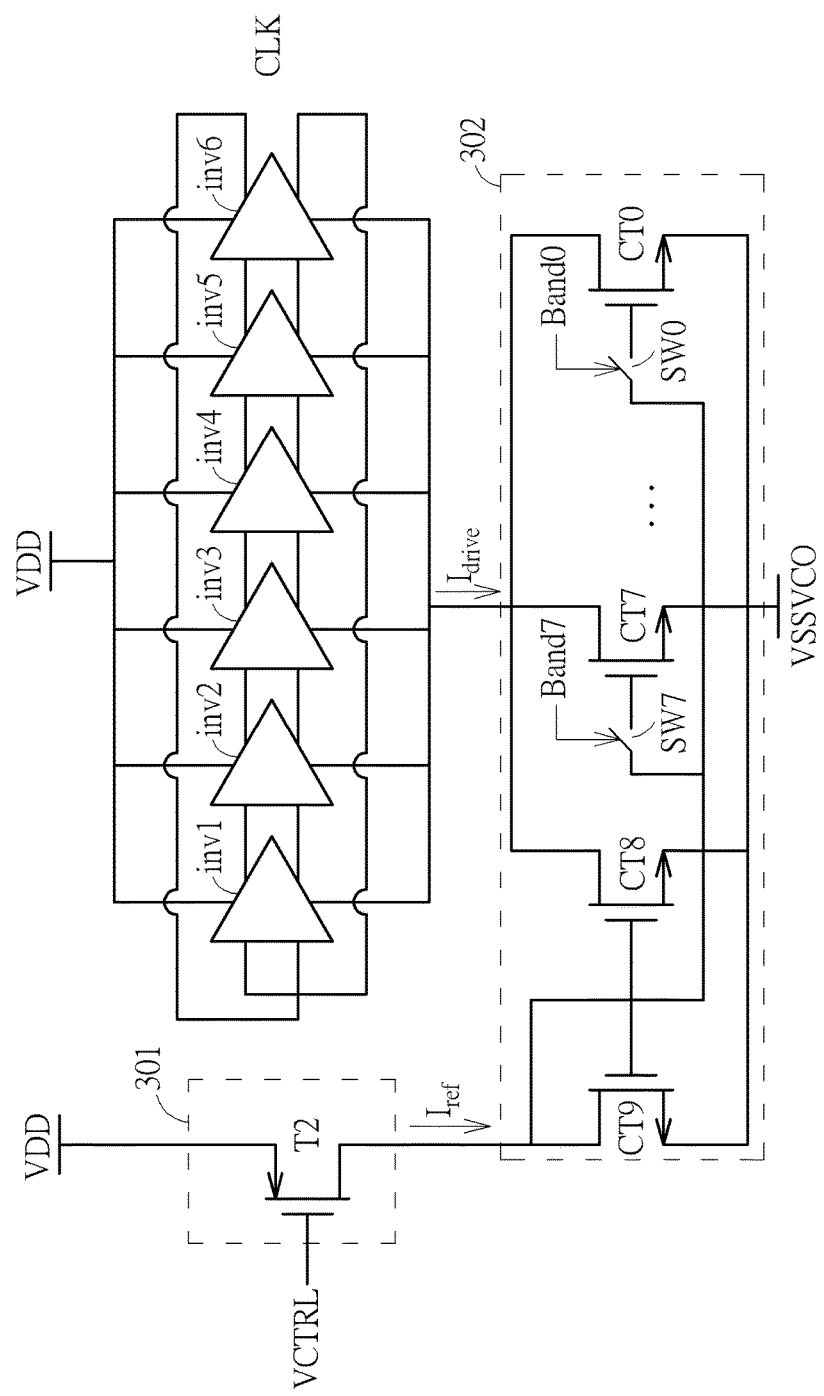
FIG. 3 is a diagram illustrating a voltage-controlled oscillator of the CDR circuit according to an embodiment of the present invention.

FIG. 3 is a diagram illustrating the VCO 103 of the CDR circuit 10 according to an embodiment of the present invention. The VCO 103 comprises a current generating circuit 301 and a control circuit 302, wherein the current generating circuit 301 comprises a transistor T2, and the control circuit 302 comprises a plurality of transistors CT0-CT9. The transistor T2 of the current generating circuit 301 generates a reference current $I_{ref}$ at a drain terminal of the transistor T2 by receiving the control voltage VCTRL with a gate terminal of the transistor T2. The plurality of transistors CT0-CT9 of the control circuit 302 operates as current mirrors by receiving the reference current $I_{ref}$ from the transistor T2. The operation of a current mirror should be well known to those skilled in the art; the detailed description is therefore omitted here. It should be noted that the gate terminals of the transistors CT0-CT7 are coupled to corresponding switches SW0-SW7 which are controlled by the band select digital signal BS. More specifically, the band select digital signal BS is first converted into a thermal code which comprises 8 bits (band0-band7) as shown in Table 3, wherein each bit of the thermal code is arranged to control the switches SW0-SW7 corresponding to the transistors CT0-CT7 shown in FIG. 3.

TABLE 3

| | | | Thermal code | | | | | | | |
|---|---|---|---|---|---|---|---|---|---|---|
| BS2 | BS1 | BS0 | Band7 | Band6 | Band5 | Band4 | Band3 | Band2 | Band1 | Band0 |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 1 |
| 0 | 1 | 0 | 0 | 0 | 0 | 0 | 0 | 1 | 1 | 1 |
| 0 | 1 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 1 | 0 | 0 | 1 | 1 | 1 | 1 | 1 | 1 |
| 1 | 1 | 0 | 0 | 1 | 1 | 1 | 1 | 1 | 1 | 1 |
| 1 | 1 | 1 | 1 | 1 | 1 | 1 | 1 | 1 | 1 | 1 |

The VCO 103 further comprises a plurality of inverters inv1-inv6 driven by a bias current $I_{drive}$ composed of the current generated from the transistors CT0-CT7. The more switches turned on by the thermal code, the stronger the bias current $I_{drive}$. By adjusting the bias current $I_{drive}$ with the band select digital signal BS, the operating band of the VCO 103 can be adjusted correspondingly to respond to different frequency bands of the CDR circuit 100. In addition, by adjusting the current $I_{CP}$ with the band select digital signal BS, the control voltage VCTRL received by the transistor T2 is correspondingly adjusted, causing an adjustment in the reference current $I_{REF}$. In other words, the adjustment of the current $I_{CP}$ with the band select digital signal BS can also adjust the operating band of the VCO 103.

Figure 4:
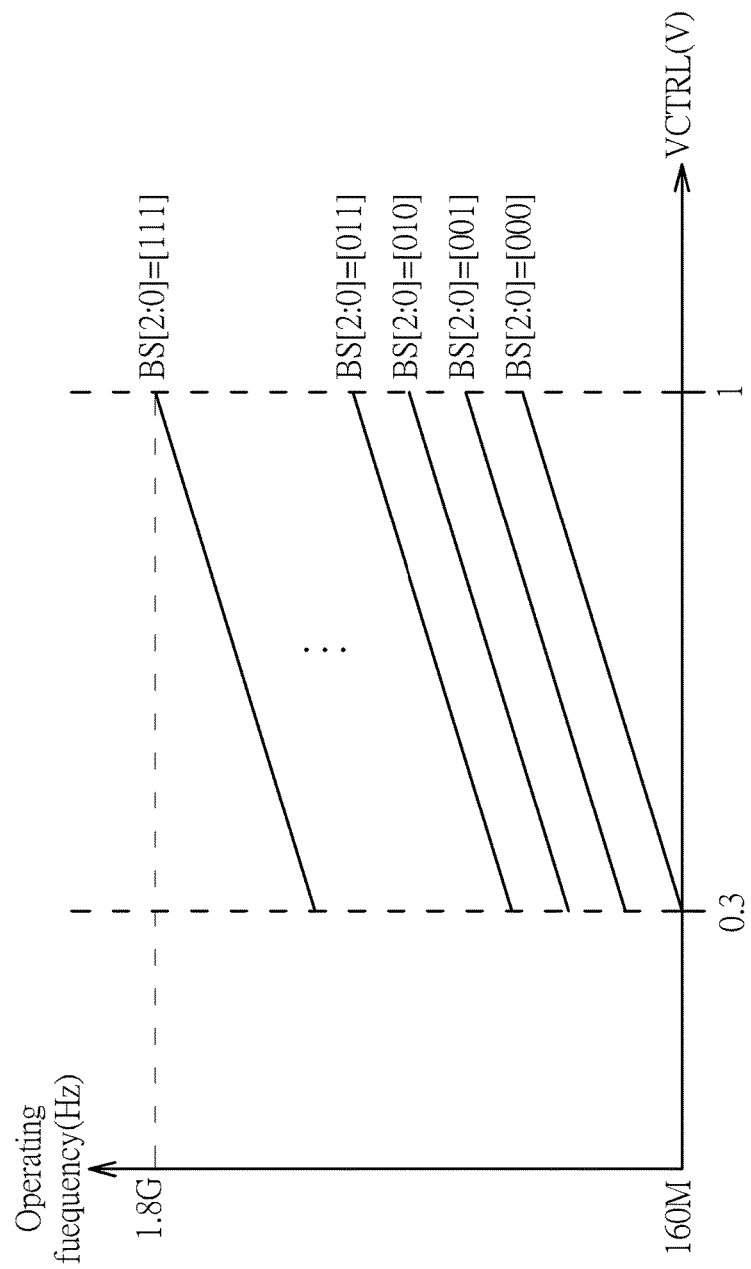
FIG. 4 is a diagram illustrating the operating band of the VCO corresponding to the control voltage and the band select digital signal according to an embodiment of the present invention.

FIG. 4 is a diagram illustrating the operating band of the VCO 103 corresponding to the control voltage VCTRL and the band select digital signal BS according to an embodiment of the present invention. As shown in FIG. 4, when the control voltage VCTRL changes from 0.3 Volt to 1 Volt, the operating band of the VCO 103 varies within a small range. When the band select digital signal BS changes, the operating band of the VCO 103 varies within a big range. In this embodiment, the control voltage VCTRL varies from 0.3 Volt to 1 Volt and the operating band of the VCO 103 varies from 160 MHz to 1.8 GHz. This is only for illustrative purposes, however, and not a limitation of the present invention.

It should be noted that the number of the inverters for generating the clock signal CLK and the number of the transistor for generating the bias current $I_{drive}$ detailed in the specification are only for illustrative purposes, and are not a limitation of the present invention. For example, the VCO 103 can receive only a part of the band select digital signal BS, e.g. two bits of the band select digital signal BS (BS[2:1]). In this case, only 4 transistors are needed to generate the bias current $I_{drive}$. These alternative designs also fall within the scope of the present invention.

Briefly summarized, the present invention proposes a CDR circuit with a band select circuit which can prevent jitter from the clock signal. More specifically, with the band select circuit 101, the LDO 102 and the VCO 103 can operate in a low operating band in response to a low frequency band and can operate in a high operating band in response to a high frequency band. In this way, the jitter caused by a huge variation in the clock signal frequency can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock data recovery (CDR) circuit, comprising:
   a band select circuit, arranged to generate a digital signal according to at least a reference voltage;
   a low dropout regulator (LDO), arranged to regulate a ground voltage, wherein the LDO adjusts an operating band of the LDO by receiving at least a part of the digital signal to adjust a bias current of an amplifier of the LDO;
   a charge pump, arranged to generate a control voltage according to at least a part of the digital signal; and
   a voltage-controlled oscillator (VCO), arranged to generate a clock signal according to the control voltage, wherein the VCO adjusts an operating band of the CDR circuit by receiving at least a part of the digital signal to adjust a bias current of the VCO.

2. The CDR circuit of claim 1, wherein the LDO comprises:
   a bias control circuit, arranged to receive at least a part of the digital signal to control the bias current passing through the amplifier of the LDO.

3. The CDR circuit of claim 1, wherein the LDO receives a regulating ground voltage generated by the VCO to regulate the ground voltage.

4. The CDR circuit of claim 1, wherein the VCO comprises:
   a current generating circuit, arranged to receive the control voltage to generate a reference current; and
   a control circuit, arranged to generate the bias current of the VCO according to the reference current and the at least a part of the digital signal.

5. The CDR circuit of claim 4, wherein the VCO adjusts the operating band of the CDR circuit by receiving the at least a part of the digital signal to adjust the bias current of the VCO by:
   receiving the at least a part of the digital signal by the control circuit to generate the bias current according to the reference current and the at least a part of the digital signal in order to adjust the operating band of the CDR circuit.

6. The CDR circuit of claim 5, wherein the adjusted operating band of the CDR circuit corresponds to one of a plurality of ranges of the clock signal frequency.

7. The CDR circuit of claim 4, wherein the VCO adjusts the operating band of the CDR circuit by receiving the at least a part of the digital signal to adjust the bias current of the VCO by:
   receiving the at least a part of the digital signal by the charge pump to generate and output the control voltage to the current generating circuit of the VCO;
   generating the reference current according to the control voltage, and outputting the reference current to the control circuit;

generating the bias current according to the reference current; and adjusting the operating band of the CDR circuit according to the bias current.

8. The CDR circuit of claim 1, further comprising:
a low pass filter (LPF) coupled between the charge pump and the VCO.

9. A clock data recovery (CDR) method for a CDR circuit, comprising:
generating a digital signal according to at least a reference voltage; and
utilizing a low dropout regulator (LDO) to regulate a ground voltage, wherein the LDO adjusts an operating band of the LDO by receiving at least a part of the digital signal to adjust a bias current of an amplifier of the LDO;
generating a control voltage according to at least a part of the digital signal; and
utilizing a voltage-controlled oscillator (VCO) to generate a clock signal according to the control voltage, wherein the VCO adjusts an operating band of the CDR circuit by receiving at least a part of the digital signal to adjust a bias current of the VCO;
wherein the LDO receives a regulating ground voltage generated by the VCO to regulate the ground voltage.

10. The CDR method of claim 9, further comprising:
receiving the control voltage to generate a reference current; and
generating the bias current of the VCO according to the reference current and the at least a part of the digital signal.

11. The CDR method of claim 9, wherein the step of the VCO adjusting the operating band of the CDR circuit by receiving the at least a part of the digital signal to adjust the bias current of the VCO comprises:
receiving the at least a part of the digital signal to generate the bias current according to a reference current and the at least a part of the digital signal in order to adjust the operating band of the CDR circuit.

12. The CDR method of claim 11, wherein the adjusted operating band of the CDR circuit corresponds to one of a plurality of ranges of the clock signal frequency.

13. The CDR method of claim 9, wherein the step of the VCO adjusting the operating band of the CDR circuit by receiving the at least a part of the digital signal to adjust the bias current of the VCO comprises:
receiving the at least a part of the digital signal to generate and output the control voltage to the VCO;
generating a reference current according to the control voltage;
generating the bias current according to the reference current; and
adjusting the operating band of the CDR circuit according to the bias current.

* * * * *